(12) United States Patent
Malila

(10) Patent No.: US 11,371,146 B2
(45) Date of Patent: Jun. 28, 2022

(54) GAS DISTRIBUTION UNIT IN CONNECTION WITH ALD REACTOR

(71) Applicant: BENEQ OY, Espoo (FI)

(72) Inventor: Matti Malila, Espoo (FI)

(73) Assignee: BENEQ OY, Espoo (FI)

( * ) Notice: Subject to any disclaimer, the term of this patent is extended or adjusted under 35 U.S.C. 154(b) by 0 days.

(21) Appl. No.: 17/605,587

(22) PCT Filed: Apr. 24, 2020

(86) PCT No.: PCT/FI2020/050266
§ 371 (c)(1),
(2) Date: Oct. 22, 2021

(87) PCT Pub. No.: WO2020/216993
PCT Pub. Date: Oct. 29, 2020

(65) Prior Publication Data
US 2022/0145462 A1 May 12, 2022

(30) Foreign Application Priority Data
Apr. 25, 2019 (FI) .................................. 20195335

(51) Int. Cl.
*C23C 16/455* (2006.01)
*C23C 16/44* (2006.01)

(52) U.S. Cl.
CPC .... *C23C 16/45561* (2013.01); *C23C 16/4412* (2013.01); *C23C 16/45512* (2013.01); *C23C 16/45544* (2013.01); *C23C 16/45563* (2013.01)

(58) Field of Classification Search
CPC .......... C23C 16/45561; C23C 16/4412; C23C 16/45512; C23C 16/45544; C23C 16/45563
See application file for complete search history.

(56) References Cited

U.S. PATENT DOCUMENTS 6,783,590 B2 * 8/2004 Lindfors ........... C23C 16/45527
117/89
9,388,492 B2 * 7/2016 White ............... C23C 16/45525
(Continued)

FOREIGN PATENT DOCUMENTS

WO WO-2020216993 A2 * 10/2020 ......... C23C 16/4401
WO WO-2020216993 A3 * 12/2020 ......... C23C 16/4401

OTHER PUBLICATIONS

Finnish Search Report issued by the Finnish Patent and Registration Office in relation to Finnish Application No. 20195335 dated Oct. 31, 2019 (1 page).
(Continued)

*Primary Examiner* — Jeffrie R Lund
(74) *Attorney, Agent, or Firm* — Robert P. Michal, Esq.; Carter, DeLuca & Farrell LLP

(57) ABSTRACT

A gas distribution unit in connection with an atomic layer deposition reactor includes an inlet surface, an outlet surface, a process gas channel extending through the gas distribution unit and being open to the inlet surface and to the outlet surface, a barrier gas inlet fitting connected to the process gas channel between the inlet surface and the outlet surface for supplying barrier gas to the process gas channel, and a barrier gas outlet fitting connected to the process gas channel between the inlet surface and the barrier gas inlet fitting for discharging barrier gas from the process gas channel.

17 Claims, 13 Drawing Sheets

(56) References Cited

U.S. PATENT DOCUMENTS

| | | | |
|---|---|---|---|
| 11,208,722 B2* | 12/2021 | White | C23C 16/45544 |
| 2001/0054377 A1* | 12/2001 | Lindfors | C23C 16/45527 |
| | | | 117/104 |
| 2003/0159653 A1 | 8/2003 | Dando et al. | |
| 2004/0009678 A1 | 1/2004 | Asai et al. | |
| 2005/0074983 A1 | 4/2005 | Shinriki et al. | |
| 2005/0092247 A1* | 5/2005 | Schmidt | C23C 16/45544 |
| | | | 427/248.1 |
| 2006/0266289 A1* | 11/2006 | Verghese | C23C 16/45563 |
| | | | 118/729 |
| 2007/0087579 A1 | 4/2007 | Kitayama et al. | |
| 2007/0269596 A1* | 11/2007 | Shero | C23C 16/52 |
| | | | 427/248.1 |
| 2009/0130859 A1 | 5/2009 | Itatani et al. | |
| 2009/0241834 A1 | 10/2009 | Kato | |
| 2010/0266765 A1* | 10/2010 | White | C23C 16/45561 |
| | | | 427/248.1 |
| 2013/0059073 A1 | 3/2013 | Jiang et al. | |
| 2013/0160709 A1* | 6/2013 | White | C23C 16/45561 |
| | | | 118/715 |
| 2013/0203267 A1* | 8/2013 | Pomarede | H01L 21/3142 |
| | | | 438/778 |
| 2015/0176126 A1 | 6/2015 | Ge et al. | |
| 2016/0268107 A1* | 9/2016 | White | H01J 37/32513 |
| 2017/0121818 A1 | 5/2017 | Dunn et al. | |
| 2019/0112707 A1* | 4/2019 | Liu | C23C 16/52 |
| 2022/0145462 A1* | 5/2022 | Malila | C23C 16/45544 |

OTHER PUBLICATIONS

International Search Report issued by the Finnish Patent and Registration Office acting as the International Searching Authority in relation to International Application No. PCT/FI2020/050266 dated Oct. 29, 2020 (4 pages).

Written Opinion of the International Searching Authority issued by the Finnish Patent and Registration Office acting as the International Searching Authority in relation to International Application No. PCT/FI2020/050266 dated Oct. 29, 2020 (9 pages).

Extended European Search Report issued by the European Patent Office in relation to European Application No. 20795895.0 dated May 9, 2022 (4 pages).

* cited by examiner

GAS DISTRIBUTION UNIT IN CONNECTION WITH ALD REACTOR

CROSS-REFERENCE TO RELATED APPLICATIONS

This application is a national phase entry under 35 U.S.C. 371 of PCT International Application No. PCT/FI2020/050266 filed Apr. 24, 2020, which claims priority to Finnish Patent Application No. 20195335, filed Apr. 25, 2019, the disclosure of each of these applications is expressly incorporated herein by reference in their entirety.

FIELD OF THE INVENTION

The present invention relates to a gas distribution unit in connection with an ALD reactor.

BACKGROUND OF THE INVENTION

A reaction chamber is a main component of an ALD (Atomic Layer Deposition) reactor, wherein substrates to be processed are placed. An ALD process is based on successive saturated surface reactions of at least two different precursor gases on a surface of a substrate wherein the saturated surface reactions provide a coating layer or film growth on the surface of the substrate. Accordingly, each precursor or process gas is separately supplied into contact with the surface of the substrate. Precursor gases and purge gas therebetween are supplied to the to the reaction chamber as sequential supply pulses for subjecting the surface of the substrate successively the at least two precursor gases.

In ALD reactors, good flow dynamics and sharp pulses are important for achieving. In order to sharpen the pulses and sometimes also as the only barrier, a principle called inert gas valving is used wherein by an appropriate feed and flow of inert gas the flow of reaction gas to in to reaction chamber and to the substrate is prevented.

The above mentioned inert gas valving function is carried out as close to the reaction chamber as possible so as to prevent the post-barrier length of a feed pipe or feed channel from causing a tail to the precursor component pulse, i.e. molecules being released from surfaces which, when mixing with the next precursor component pulse, cause direct reactions between the two different precursors of the separate precursor component pulses and cause CVD (Chemical Vapour Deposition) growth on the surface of the substrate. This CVD growth owing to the tail is absolutely not to be allowed on the substrate since then the deposition no longer takes place according to principles of atomic layer deposition in which the growth of the deposition layer or film is controlled by the surface.

Gas distribution units are used in connection with ALD reactors for supplying the process gasses, meaning precursors and purge gases, to the reaction chamber by utilizing the inert gas valving. Prior art gas distribution unit use grooves provided in plates that provided 3D pipe systems by stacking such groove plates on top of one another. A problem is to provide the multiple barrier grooves and the barrier feeds received therein as well as suctions symmetrically and as identical for several starting materials. The number and/or size of the plates increases as a result of such packaging. When it is desired to pack a reaction chamber with its barriers in a small or flat space, the plate solution easily becomes difficult to implement. Other prior art gas distribution unit are made as multi-part unit having multiple interconnected parts in which the gas channels for supplying precursors, purge gas and barrier gas extend successively through several parts of the gas distribution unit. There is sealing surfaces or boundary surfaces between each separate part of the gas distribution unit.

The disadvantage of the prior art gas distribution units is that the sealing surfaces between the separate parts must be provided with sealing members. High process temperatures in the ALD process restricts material choices for the sealing members as not all sealing materials can stand high temperatures above 150° C. Furthermore, precursor supply channels and discharge channels passed through the same sealing or boundary surfaces causing mixing the precursor and discharge flows or diffusion of the precursor or discharge flow along the sealing surfaces, especially when the sealing members were compromised or deteriorated in high temperatures. This further causes additional cleaning requirements and the operating time of the gas distribution unit is shortened.

BRIEF DESCRIPTION OF THE INVENTION

An object of the present invention is to provide a gas distribution unit so as to solve or at least alleviate the prior art disadvantages.

The objects of the invention are achieved by gas distribution unit which is characterized by what is stated in the independent claim 1.

The preferred embodiments of the invention are disclosed in the dependent claims.

The invention is based on the idea of providing gas distribution unit in connection with an atomic layer deposition reactor comprising a reaction chamber. The gas distribution unit comprises gas channels for feeding precursor gas and barrier gas. According to the above mentioned the gas distribution unit comprises an inlet surface via which gases are supplied into the gas distribution unit and an outlet surface via which precursor gases are discharged from the gas distribution unit. The gas distribution unit further comprises a process gas channel extending through the gas distribution unit and being open to the inlet surface and to the outlet surface, a barrier gas inlet fitting connected to the process gas channel between the inlet surface and the outlet surface for supplying barrier gas to the process gas channel, and a barrier gas outlet fitting connected to the process gas channel between the inlet surface and the barrier gas inlet fitting for discharging barrier gas from the process gas channel.

Accordingly, the barrier gas may be supplied in upstream direction in the process gas channel from the barrier gas inlet fitting to the barrier gas outlet fitting via the process gas channel. Thus, the barrier gas may be supplied in the process gas channel in the direction from the outlet surface towards the inlet surface from the from the barrier gas inlet fitting to the barrier gas outlet fitting via the process gas channel. Therefore, there is no need provide any boundary surfaces or sealing surfaces between the inlet surface and the outlet surface and the gas distribution unit may be provided as one part between the inlet surface and the output surface.

In one embodiment, the barrier gas inlet fitting and/or the barrier gas outlet fitting comprises adjustment elements or reduction elements for providing flow choking. Thus, the flow in the inlet fitting and/or outlet fitting may be adjusted.

In one embodiment, the barrier gas inlet fitting may comprise a barrier gas supply channel connected to the process gas channel between the inlet surface and the outlet surface. Thus, the barrier gas supply channel is arranged to supply barrier gas to the process gas channel between the inlet surface and the outlet surface.

The barrier gas inlet fitting may comprise a barrier gas distribution cavity and a barrier gas inlet channel. The barrier gas inlet channel is provided between the inlet surface and the barrier gas distribution cavity.

Alternatively, barrier gas inlet fitting may comprise a barrier gas distribution cavity and a barrier gas inlet channel. The barrier gas inlet channel is provided between the inlet surface and the barrier gas distribution cavity, and the barrier gas supply channel is provided between the barrier gas distribution cavity and the process gas channel.

Accordingly, the barrier gas may be supplied via the inlet surface and the barrier gas inlet channel to the barrier gas distribution cavity. The barrier gas may then be further distributed from the barrier gas distribution cavity to the process gas channel via the barrier gas supply channel.

The barrier gas distribution cavity may be provided between the inlet surface and the outlet surface. This enables supplying the providing a counter flow to the process gas channel towards the inlet surface.

In an alternatively embodiment, the barrier gas inlet fitting comprises a barrier gas inlet channel, and the barrier gas inlet channel is arranged to extend between the inlet surface and the barrier gas supply channel. Thus, in this embodiment the barrier gas distribution cavity may be omitted and the barrier gas inlet channel may be connected directly to the barrier gas supply channel.

In one embodiment, the gas distribution unit may comprise two or more barrier gas distribution cavities, or alternatively two or more barrier gas inlet fittings. Thus, there may be one barrier gas distribution cavity for each process gas channel, or two or more process gas channels may have common barrier gas inlet fitting and/or the barrier gas distribution cavity.

Similarly, in one embodiment, the gas distribution unit may comprise two or more barrier gas collection cavities, or alternatively two or more barrier gas outlet fittings. Thus, there may be one barrier gas collection cavity for each process gas channel, or two or more process gas channels may have common barrier gas outlet fitting and/or the barrier gas collection cavity.

The barrier gas outlet fitting may comprise a barrier gas discharge channel connected to the process gas channel between the inlet surface and the barrier gas supply channel. Thus, the barrier gas may be discharged from the process gas channel upstream of the barrier gas supply channel and between the barrier gas supply channel and the inlet surface.

In one embodiment, the barrier gas outlet fitting may comprise a barrier gas collecting cavity and the barrier gas discharge channel. The barrier gas discharge channel is arranged to extend between the process gas channel and the barrier gas collection cavity.

Accordingly, the barrier gas may be discharged from the process gas channel to the barrier gas collection cavity via the barrier gas discharge channel.

In one embodiment, the barrier gas collecting cavity is provided between the inlet surface and the outlet surface.

Alternatively, the barrier gas collecting cavity may be provided between the inlet surface and the barrier gas distribution cavity, or between the inlet surface and the barrier gas supply channel.

Accordingly, the barrier gas may be discharged from the process gas channel to the barrier gas collection cavity upstream of the barrier gas supply and between the barrier gas supply and the inlet surface.

The gas distribution unit may comprise one or more or two or more process gas channels extending between and open to the inlet surface and the outlet surface. Each of the process gas channels may be provided with barrier gas supply and barrier gas discharge for carrying the inert gas valving in each of the process gas channels.

The gas distribution unit may comprise a first process gas channel extending through the gas distribution unit and being open to the inlet surface and to the outlet surface, and a second process gas channel extending through the gas distribution unit and being open to the inlet surface and to the outlet surface. The gas distribution unit further comprises a first barrier gas supply channel connected to the first process gas channel between the inlet surface and the outlet surface, and a second barrier gas supply channel connected to the second process gas channel between the inlet surface and the outlet surface.

Accordingly, each of the process gas channels is provided with separate barrier gas supply channel. This means that a separate barrier gas supply channel is connected to the each of the process gas channels for supplying barrier gas separately and independently to each of the process gas channels.

The gas distribution unit may further comprise the barrier gas distribution cavity and the barrier gas inlet channel. Further, the first barrier gas supply channel may be provided between the first process gas channel and barrier gas distribution cavity and the second barrier gas supply channel may be provided between the second process gas channel and barrier gas distribution cavity.

According to the above mentioned the barrier gas is first supplied to the barrier gas distribution cavity via the barrier gas inlet channel and then distributed from the barrier gas distribution cavity to the first and second process gas channel via the first and second barrier gas supply channel. Accordingly, the gas distribution unit may comprise two or more process gas supply channels, such as first and second precursor channel and a purge gas channel, and the barrier gas may be distributed or supplied separately these process gas channels via the barrier gas distribution cavity.

The barrier gas distribution unit may comprise a first barrier gas inlet channel and as second barrier gas inlet channel. The first barrier gas inlet channel extends between the inlet surface and the first barrier gas supply channel. The second barrier gas inlet channel extending between the inlet surface and the second barrier gas supply channel. In this embodiment, there is no barrier gas distribution cavity, but each of the process gas channels has own barrier gas inlet channel and barrier gas supply channel.

The gas distribution unit may further comprise a first barrier gas discharge channel connected to the first process gas channel between the inlet surface and the first barrier gas supply channel, and a second barrier gas discharge channel connected to the first process gas channel between the inlet surface and the first barrier gas supply channel. Accordingly, there is a separate barrier gas discharge channel in each or connected to each of the process gas channels for discharging the barrier gas and providing out flow of the barrier gas in order to generate inert gas valving in each of the process gas channels The gas distribution unit may also comprise the barrier gas collecting cavity. Thus, the first barrier gas discharge channel extends between the first process gas channel and the barrier gas collecting cavity, and the second barrier gas discharge channel extends between the second process gas channel and the barrier gas collecting cavity. Accordingly, the discharged barrier gases are collected two or more process gas channels to barrier gas collecting cavity and they may be discharged from the gas distribution unit collectively via the barrier gas collection cavity.

In one embodiment, the gas distribution unit is a solid body and the process gas channels, the barrier gas inlet channel, the barrier gas supply channels and the barrier gas discharge channels are provided as borings to the gas distribution unit. The solid body makes temperature control in the gas distribution unit easy. Further, the process gas channels may be provided as direct borings between the inlet surface and the outlet surface and no connection are needed.

Solid body may be formed by casting, 3D printing or the like technique enabling forming a solid body.

The gas distribution unit may comprise the inlet surface at a first end of the gas distribution unit, the outlet surface at a second end of the gas distribution unit and one or more side walls extending between the inlet surface and the outlet surface.

Further, in one embodiment the gas distribution cavity is provided to the one or more side walls between the inlet surface and the outlet surface.

In one embodiment, the gas collecting cavity is provided to the one or more side walls between the inlet surface and the outlet surface.

In a yet alternative embodiment, the gas distribution cavity and the gas collecting cavity are provided to the one or more side walls between the inlet surface and the outlet surface.

According to the above mentioned, the barrier gas distribution cavity and/or the barrier gas collecting cavity may be formed as recess to the solid body and specifically to the side wall(s) of the gas distribution unit. Thus, the barrier gas distribution cavity and/or the barrier gas collecting cavity may extend from outer surface of the side wall(s) of the gas distribution unit into the solid body thereof. The barrier gas distribution cavity and/or the barrier gas collecting cavity may be provided with cover flanges for closing the cavities.

In an alternative embodiment, the gas distribution unit is not one solid body, but comprises an inlet flange and an outlet flange. The inlet flange comprises the inlet surface facing away from the outlet flange, and the outlet flange comprises the outlet surface facing away from the inlet flange.

Further, in one embodiment the process gas channel comprises a process gas pipe extending between the inlet flange and the outlet flange.

In an alternative embodiment, the process gas channel comprises a process gas pipe extending between the inlet flange and the outlet flange. Further, the barrier gas inlet channel, the barrier gas supply channels and the barrier gas discharge channels are also provided as pipes to the gas distribution unit.

In a further alternative embodiment, the process gas channel comprises a process gas pipe extending between the inlet flange and the outlet flange. Further, the barrier gas inlet channel, the barrier gas supply channels and the barrier gas discharge channels are provided as borings to the inlet flange to the gas distribution unit.

The pipes may be welded to the inlet and outlet flange. This may enable the manufacturing of the gas distribution to become easier and the gas distribution may be made lighter.

Alternatively, the gas distribution unit may comprise a distribution flange comprising the barrier gas distribution cavity or a collection flange comprising the barrier gas collection cavity. Alternatively, the gas distribution unit may comprise a distribution flange comprising the barrier gas distribution cavity and a collection flange comprising the barrier gas collection cavity.

Accordingly, the gas distribution unit may comprise separate flange(s) for the barrier gas distribution cavity and for the barrier gas collecting cavity. The barrier gas inlet, supply and discharge channels may be formed with pipes. This may further enable the manufacturing of the gas distribution to become easier and the gas distribution may be made lighter.

In another alternative embodiment, the barrier gas distribution cavity is provided to the outlet flange, or the barrier gas distribution cavity is provided to the outlet flange and the barrier gas supply channel is provided as boring to the outlet flange. Thus, in this embodiment, there is no need for separate distribution flange.

In a yet alternative embodiment, the barrier gas collection cavity is provided to the inlet flange, or the barrier gas collection cavity is provided to the inlet flange and the barrier gas discharge channel is provided as boring to the inlet flange. Therefore, there is no need for separate collecting flange.

In a further embodiment, the barrier gas distribution cavity is provided to the outlet flange and the barrier gas collection cavity is provided to the inlet flange, the barrier gas distribution cavity is provided to the outlet flange and the barrier gas supply channel is provided as boring to the outlet flange, and the barrier gas collection cavity is provided to the inlet flange and the barrier gas discharge channel is provided as boring to the inlet flange. Accordingly, there is no need for separate distribution flange and collection flange.

An advantage of the invention is that the structure gas distribution unit is simple as it may be implemented as part comprising also all the necessary fittings for inert gas valving. Furthermore, as the number of parts in the gas distribution unit is decreased also the number of sealing surface or boundary surfaces of the is decreased. Thus, there is only one sealing surface on the inlet surface via which the process gases flow. The inlet surface may be arranged as far from the reaction chamber as possible and thus at lower temperature which enables use of elastomer sealings at the inlet surface even at high reaction chamber temperatures.

BRIEF DESCRIPTION OF THE DRAWINGS

The invention is described in detail by means of specific embodiments with reference to the enclosed drawings, in which.

DETAILED DESCRIPTION OF THE INVENTION

Figure 1:
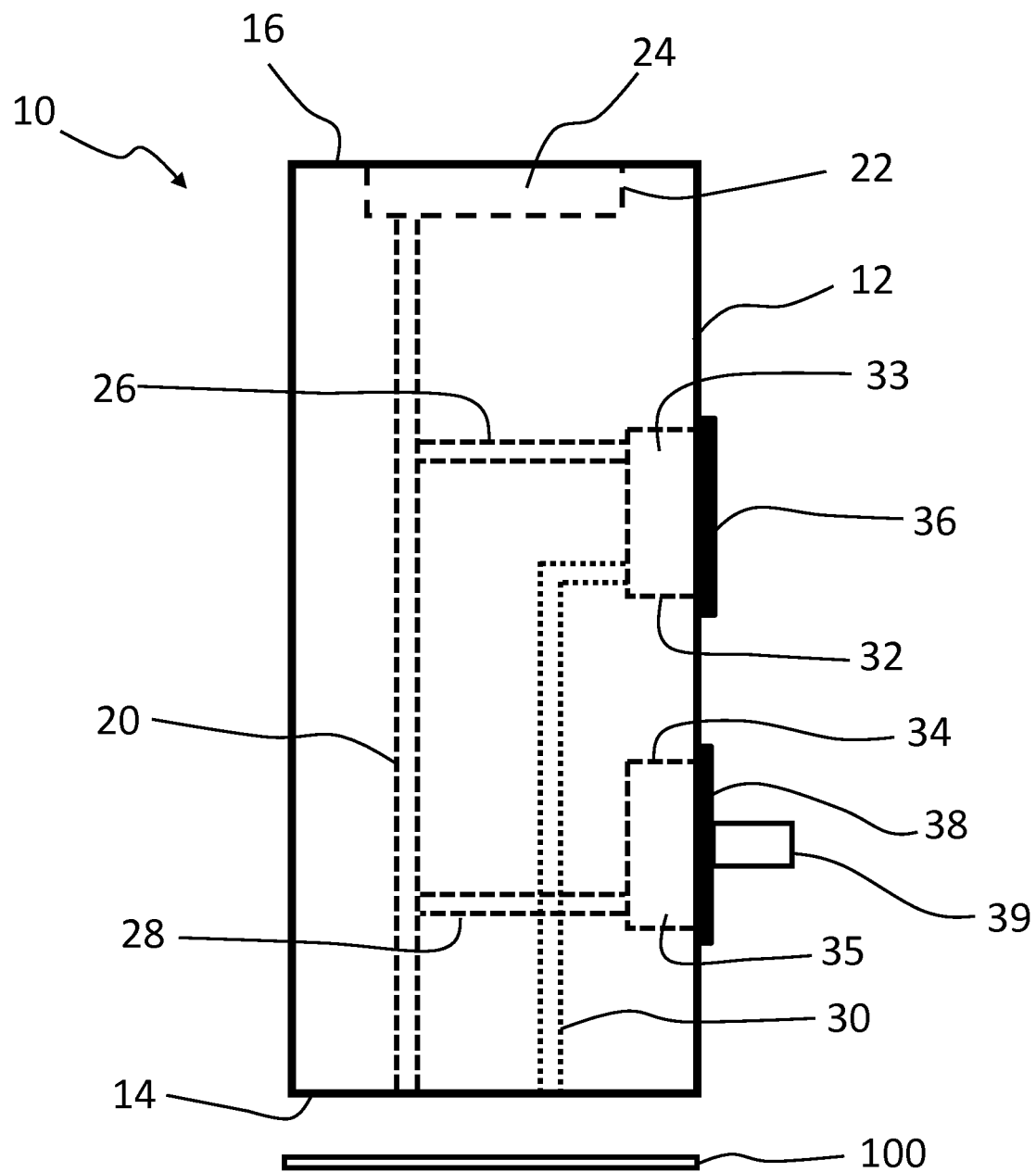
FIG. 1 shows schematically one embodiment of the gas distribution unit according to the present invention.

FIG. 1 shows schematically one embodiment a gas distribution unit 10 of the present invention. The gas distribution unit provides an arrangement in connection with the atomic layer deposition reactor (ALD-reactor) for supplying process gases into a reaction chamber of the ALD-reactor. In the embodiment of FIG. 1 the gas distribution unit 10 is formed of or made of solid body. The solid body is preferably made of solid metal such as steel, stainless steel or aluminium. The gas channels may be made to the gas distribution unit 10 by boring and as borings. Thus, the channels are substantially linear.

The gas distribution unit 10 comprises an inlet surface 14 via which gases are supplied into the gas distribution unit 10 and an outlet surface 16 via which gases are discharged from the gas distribution unit 10. The inlet surface 14 is provided to a first end of the gas distribution unit 10 and the outlet surface 16 is arranged to a second end of the gas distribution unit 10. Therefore, the inlet surface 14 and the outlet surface 16 are arranged opposite to each other. The gases are further supplied into the reaction chamber via the outlet surface 16. Thus, the outlet surface 16 may be in fluid communication with the interior or reaction space of the reaction chamber of the ALD-reactor. The outlet surface 16 may comprises a supply cavity or supply recess 22 extending into the gas distribution unit 10 from the outlet surface 16 or towards the inlet surface 14 and form a supply space 24. The supply space 24 is open to the outlet surface 16.

The gas distribution unit 10 further comprises a process gas channel 20 extending through the gas distribution unit 10 and being open to the inlet surface 14 and to the outlet surface 16. The process gas channel 20 extends from the inlet surface 14 towards the outlet surface 16 and opens to the supply space 24 and further to the outlet surface 16. Thus, process gas may be supplied via the inlet surface 14 through the process gas channel 20 to the outlet surface 16 and the supply space 24.

The inlet surface 14 may be connected to gas connection member(s) (not shown) from providing gases to the gas distribution unit 10. There may be provided a sealing member 100 in connection with the inlet surface 14 for sealing the inlet surface 14 and the gas connection members to each other at the inlet surface 14. The sealing member may be any kind of sealing member, such as metal sealing member, glass fibre sealing member, preferably, elastomer sealing member or the like.

The gas distribution unit 10 further comprises a barrier gas inlet fitting 26, 30, 32 connected to the process gas channel 20 between the inlet surface 14 and the outlet surface 16 for supplying barrier gas to the process gas channel 20. The barrier gas inlet fitting is arranged to supply barrier gas to the process gas channel 20 between the inlet surface 14 and the outlet surface.

The gas distribution unit 10 also comprises a barrier gas outlet fitting 28, 34, 39 connected to the process gas channel 20 between the inlet surface 14 and the barrier gas inlet fitting 26, 30, 32 for discharging barrier gas from the process gas channel 20.

Accordingly, the barrier gas inlet fitting 26, 30, 32 is arranged to supply barrier gas into the process gas channel 20 between the inlet surface 14 and the outlet surface 16 and the barrier gas outlet fitting 28, 34, 39 is arranged to discharge the barrier gas from the process gas channel 20 between the barrier gas inlet fitting 26, 30 32. Thus, the barrier flows in the process gas channel 20 in a direction from the outlet surface 16 towards the inlet surface 14 and between the barrier gas inlet fitting 26, 30, 32 and the outlet fitting 28, 34, 39. The process gas is supplied in the process gas channel 20 to the reaction chamber in a direction from the inlet surface 14 to the outlet surface. Thus, the barrier gas is supplied in the process gas channel in opposite direction in relation to the process gas and as counter flow. Thus, inert gas valving is achieved.

Figure 3:
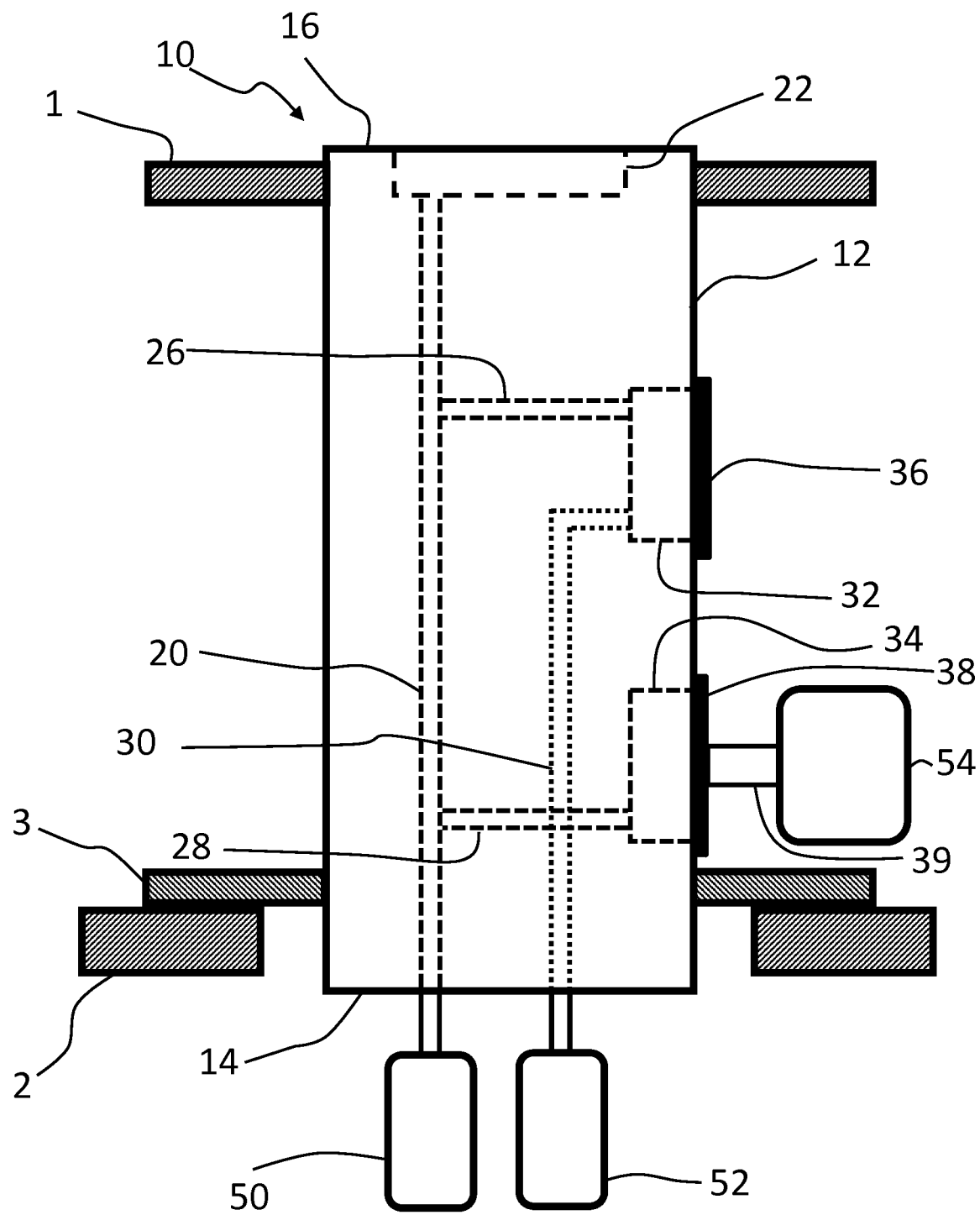
FIG. 3 shows schematically the gas distribution unit of FIG. 1 in connection with an ALD reactor.

FIG. 3 shows schematically the gas distribution unit 10 in connection with the ALD-reactor. The ALD-reactor comprises a vacuum chamber 2 and a reaction chamber 1 provided inside the vacuum chamber 2. The gas distribution unit 10 is arranged to extend from outside the vacuum chamber 2 into the reaction chamber 1. Accordingly, the inlet surface 14 is outside the vacuum chamber 2 or opens outside the vacuum chamber 2, and similarly the inlet surface 16 is arranged inside the reaction chamber 1 or opens inside the reaction chamber 1. The vacuum chamber 2 and the reaction chamber 1 are provided with openings for receiving the gas distribution unit 10. The gas distribution unit 10 may be attached to the vacuum chamber 2 or wall thereof with a first flange 3. Similarly, the gas distribution unit 10 may be attached to the reaction chamber 1 or wall thereof with a second flange 3.

There is further a process gas source 50 connected to the process gas channel 20 or in fluid communication with the process gas channel 20 for feeding process gas to the process gas channel 20 and further to the reaction chamber 1. A barrier gas source 52 is connected to the barrier gas inlet fitting 26, 30, 32 or in fluid communication with the barrier gas inlet fitting 26, 30, 32 for feeding barrier gas to the gas distribution unit 10 and to the process gas channel 20.

The barrier gas may be supplied via the inlet fitting 26, 30, 32, from the barrier gas source 52 by utilizing a barrier gas supply pump (not shown). Additionally, there is a barrier gas vacuum pump 54 or the like suction device connected to the barrier gas outlet fitting 28, 34, 39 for discharging barrier gas from the process gas channel 20 and out of the gas distribution unit 10. The vacuum pump 54 may also be arranged to provide barrier gas flow or suction from the barrier gas source 52 to the gas distribution unit 10, thus the barrier gas supply pump may be omitted.

The ALD-reactor and the gas distribution unit 10 are driven or utilized such that barrier gas, e.g. nitrogen or some other inert gas, is continuously supplied via the barrier gas inlet fitting 26, 30, 32 1, as disclosed above. The back suction with the barrier gas vacuum pump 54 via the barrier gas outlet fitting 28, 34, 39 may be continuously turned on. Accordingly, the barrier gas flows continuously via the barrier gas inlet fitting 26, 30, 32 to the process gas channel 20. When the process gas flow from the process gas source 50 in the process gas channel 20 is interrupted, no other flow than diffusion flow of process gas comes from the process gas source 50 along the process gas channel 20, a barrier produced by means of the barrier gas flow works and such a reaction gas tail is conveyed to the barrier gas outlet fitting 28, 34, 39 with the back suction. When the reaction gas pulse is supplied either assisted by a carrier gas or without carrier gas through the process gas channel 20 and the gas distribution unit 10, some of it is sacrificed to the barrier gas outlet fitting 28, 34, 39, but a vast majority thereof continues to travel along the process gas channel 20 past the barrier gas outlet fitting 28, 34, 39 and directly to the reaction chamber 1 via the outlet surface 16. Barrier gas, such as nitrogen, is also mixed with the process gas flow in the process gas channel 20 into the reaction chamber 1. When the process gas flow and the feed of the possible carrier gas is terminated, the gas distribution unit 10 returns automatically to a state closing the process gas flow in the process gas channel 10, as the barrier gas again flows via the barrier gas inlet fitting 26, 30, 32 to the process gas channel 20 and further to the outlet fitting 28, 34, 39.

When it is desired to enhance the operation of the gas distribution unit 10 and decrease process gas losses, the supply of the barrier gas, e.g. nitrogen, may be synchronized with the pulsing of the process gas.

All the above mentioned in connection with FIGS. 1 and 3 are applicable to all embodiments of the present invention.

As shown in FIG. 1, the barrier gas inlet fitting 26, 30, 32 comprises a barrier gas inlet channel 30, a barrier gas distribution cavity 32 and a barrier gas supply channel 26. The barrier gas inlet channel 30 is provided between the inlet surface 14 and the barrier gas distribution cavity 32. Thus, the barrier gas inlet channel 30 is open to the inlet surface 14 and extends from the inlet surface 14 to the barrier gas distribution cavity 32 and is one to the barrier gas distribution cavity 32 and distribution space 33 thereof. The barrier gas supply channel 26 is provided between the barrier gas distribution cavity 32 and the process gas channel 20. Thus, the barrier gas supply channel 26 is open to the barrier gas distribution cavity 32 and extends from the barrier gas distribution cavity 32 to the process gas cannel 20 and is open to the process gas channel 20. Accordingly, the barrier gas is supplied to the gas distribution unit 10 via the inlet surface 14 and along the barrier gas inlet channel 30 to the barrier gas distribution cavity 30 and further from the barrier gas distribution cavity 32 to the process gas channel 20 via the barrier gas supply channel 26.

The outlet fitting 28, 34, 39 comprises a barrier gas discharge channel 28 connected to the process gas channel 20 between the inlet surface 14 and the barrier gas supply channel 26. The barrier gas outlet fitting 28, 34, 39 further comprises a barrier gas collecting cavity 34 having a barrier gas collection specie 35. The barrier gas discharge channel 28 is arranged to extend between the process gas channel 20 and the barrier gas collection cavity 34. The barrier gas discharge channel 20 is open to the process gas supply channel 20 and to the process gas collecting cavity 34 for discharging barrier gas from the process gas channel 20 to the barrier gas collecting cavity 34. There is further provided a barrier gas exhaust conduit 39 connected to the barrier gas collecting cavity 34 for exhausting barrier gas from the gas distribution unit 10. The barrier gas exhaust conduit may be further connected to the barrier gas vacuum pump 54 of providing suction of barrier gas or discharge flow of barrier gas.

The barrier gas inlet channel 30, the barrier gas supply channel 26 and the barrier gas discharge channel 28 may be provided by boring and as borings to the solid body of the gas distribution unit 10.

The barrier gas distribution cavity 32 is provided between the inlet surface 14 and the outlet surface 16, as shown in FIG. 1. The barrier gas collecting cavity 34 is provided between the inlet surface 14 and the outlet surface 16, or between the inlet surface 14 and the barrier gas distribution cavity 32 in direction between the inlet surface 14 and the outlet surface 16. Alternatively, the barrier gas collecting cavity 34 is provided between the inlet surface 14 and the barrier gas supply channel 26 in the direction between the inlet surface 14 and the outlet surface 16.

The gas distribution unit 10 comprises the inlet surface 14 at the first end of the gas distribution unit 10, the outlet surface 16 at the second end of the gas distribution unit 10 and one or more side walls 12 extending between the inlet surface 14 and the outlet surface 16. The gas distribution unit 10 may have circular, elliptical, triangle, square or polygonal cross-sectional shape, and thus the number of side walls 12 may differ. In FIG. 1, the gas distribution unit 10 has circular cross-sectional shape. As the gas distribution unit 10 is provided as solid body, the barrier gas distribution cavity 32 and the barrier gas collecting cavity 34 are provided to the wall 12 between the inlet surface 14 and the outlet surface 16.

As shown in FIG. 1, the barrier gas distribution cavity 34 and the barrier gas collecting cavity 34 are formed as recess to the solid body and specifically to the side wall 12 of the gas distribution unit 10. Thus, the barrier gas distribution cavity 32 and the barrier gas collecting cavity 34 extend from outer surface of the side wall 12 of the gas distribution unit 10 into the solid body thereof. The barrier gas distribution cavity 32 the barrier gas collecting cavity 34 may be provided with cover flanges 36 and 38, respectively, for closing the cavities. Thus, the barrier gas distribution cavity 32 and the barrier gas collecting cavity 34, and the barrier gas distribution space 33 and the barrier collecting space 35 thereof, are closed with the flanges 36, 38 such that the flanges 36 and 38 may be opened or removed for cleaning the barrier gas distribution cavity 32 the barrier gas collecting cavity 34.

The barrier gas collection cavity flange 38 is provided with the barrier gas exhaust conduit 39 connected to the barrier gas collecting cavity 34 for exhausting barrier gas from the barrier gas collecting cavity 34 and from gas distribution unit 10. The barrier gas exhaust conduit 39 may be further connected to the barrier gas vacuum pump 54 of providing suction of barrier gas or discharge flow of barrier gas. The barrier gas exhaust conduit 39 is open to the barrier gas collecting cavity 34.

The cover flanges 36, 38 may be sealed with cavity sealing elements towards outside of the gas distribution unit. However, the cavity sealing may also be omitted. In barrier gas distribution cavity, there may be overpressure due to supply of barrier gas. In the barrier gas collection, the suction through the barrier gas exhaust conduit prevents contaminations from entering the barrier gas collection cavity.

According to the above mentioned, the barrier gas distribution cavity 32 and the barrier gas collecting cavity 34 are thus provided to the solid body of the gas distribution unit 10 and to the side wall 12 and on the surface of the side wall surface 12.

Figure 2:
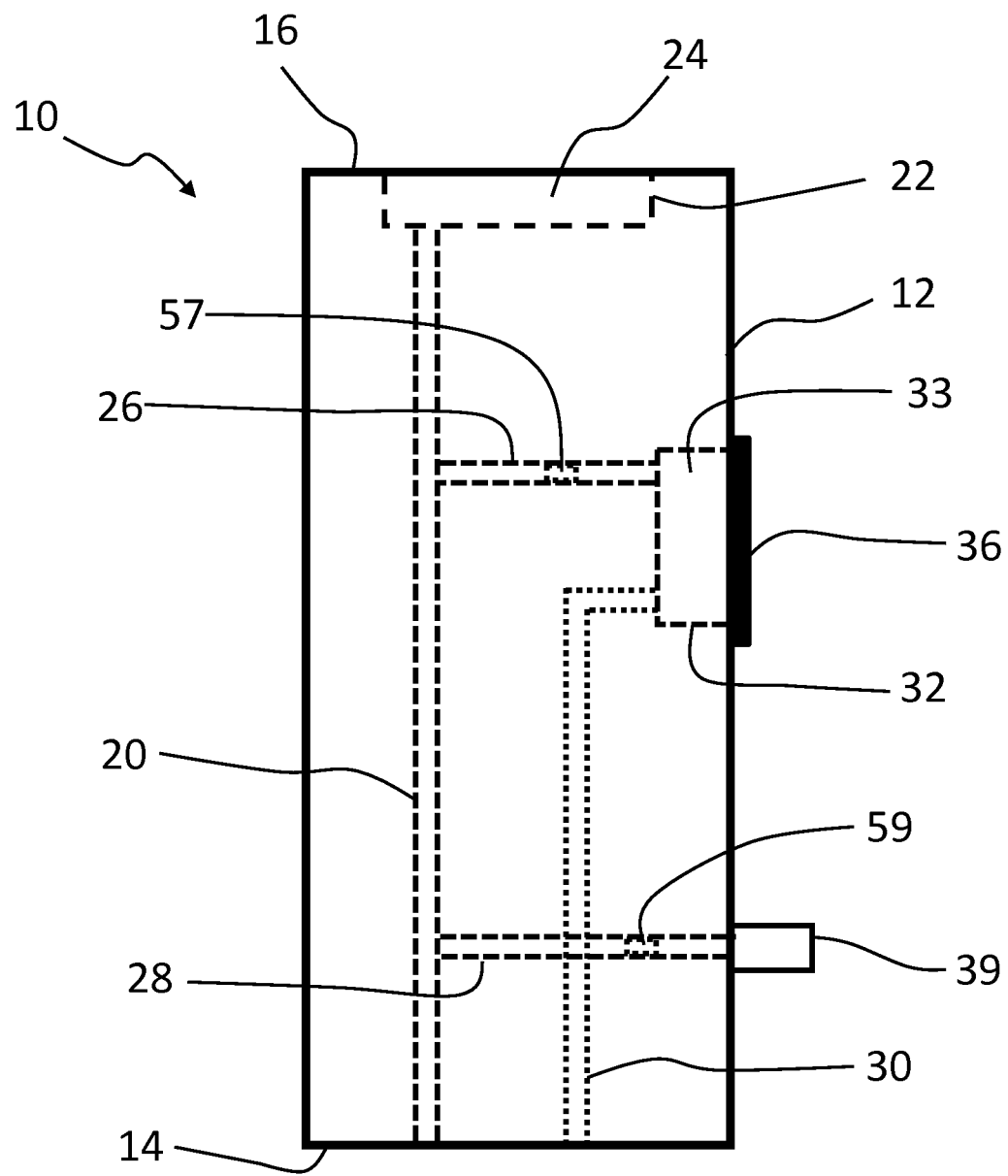
FIG. 2 shows schematically another embodiment of the gas distribution unit according to the present invention.

FIG. 2 shows an alternative embodiment of the gas distribution unit 10 in which the barrier gas collecting cavity 34 is omitted. The barrier gas discharge channel 28 extends to the outer surface of the side wall 12. Thus, the barrier gas discharge channel 28 is open to the process gas channel 20 and to the outer surface of the side wall 12. The barrier gas exhaust conduit 39 is connected to the barrier gas discharge channel 28 on the side wall 12.

As shown in FIG. 2, the inlet fitting, or the barrier gas supply channel 26, comprises a first adjustment element 57 for adjusting the barrier gas flow to the process gas channel 20. Similarly, the outlet fitting, or the barrier gas discharge channel 28, comprises a second adjustment element 59. The adjustment elements 57, 59 provide flow choking. The adjustment element 57, 59 may be choke screw, i.e. a screw member having a channel for providing a desired choking effect drilled therein. The adjustment member may also be reduction formed by narrowing the channels 26, 28 so that a desired choking effect is achieved. The first and second adjustment elements 57, 59 are preferably equal in size in all barrier gas supply channels 26 or barrier inlet fittings and/or in all barrier gas discharge channels 28 or in barrier gas outlet fittings so that the barrier gas flows may be divided equally.

Figure 4:
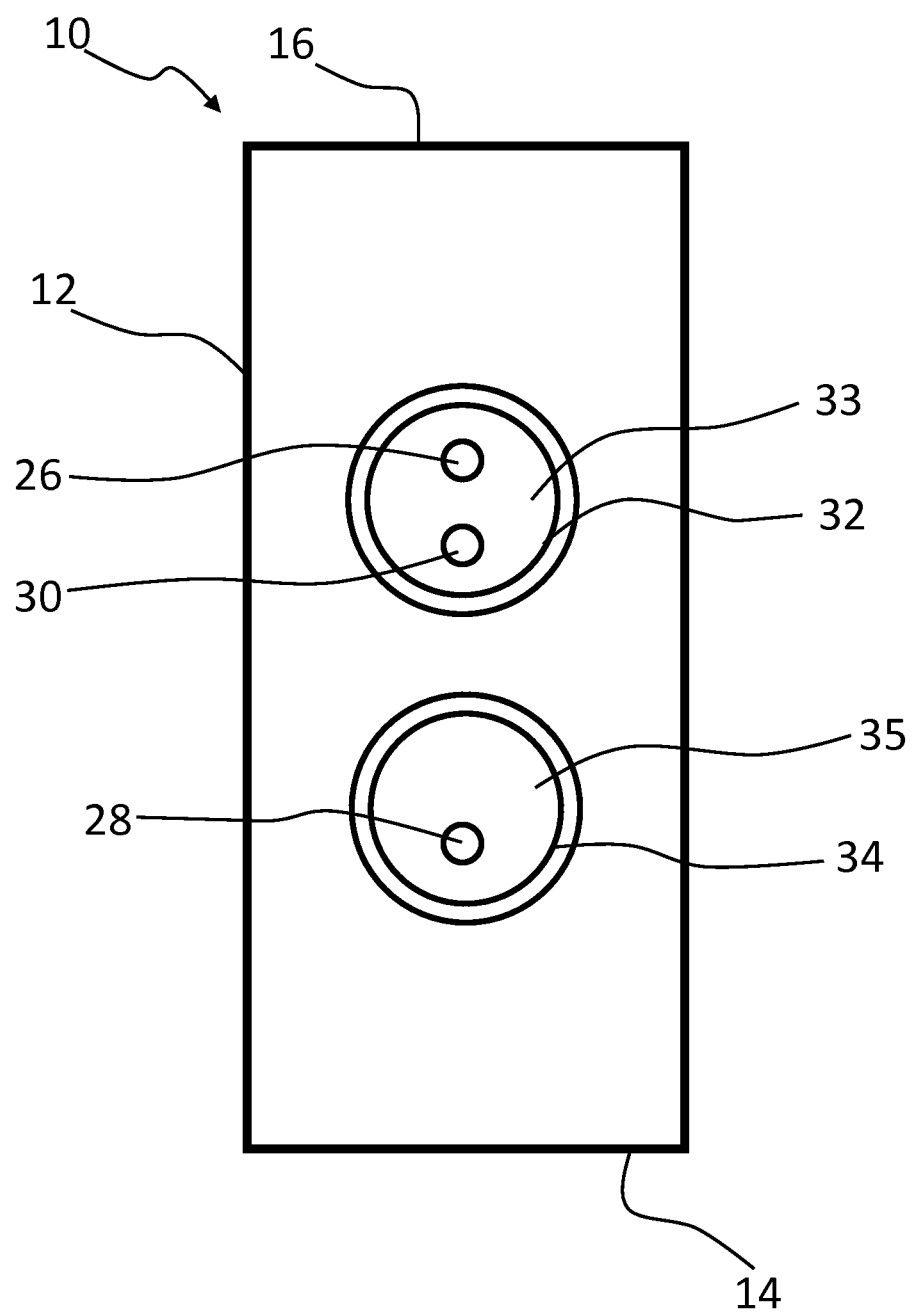
FIG. 4 shows schematically a side view of the gas distribution unit of FIG. 1.

FIG. 4 shows schematically a side view of the gas distribution unit 10 of FIG. 1 from direction of the barrier gas distribution cavity 32 and the barrier gas collecting cavity 34. The barrier gas distribution cavity 32 and the barrier gas collecting cavity 34 are shown without the cover flanges 36, 38. As shown in FIG. 4, the barrier gas inlet channel 30 extends from the inlet surface 14 to the barrier gas distribution cavity 32 and opens to barrier gas distribution cavity 32 and the distribution space 33 thereof. The barrier gas supply channel 26 extends from the barrier gas distribution cavity 32 to the process gas channel 20 and the barrier gas supply channel is open to the barrier gas distribution cavity 32 and distribution space 33 thereof. Accordingly, the barrier gas flows via the barrier gas inlet channel 30 to the barrier gas distribution cavity 32 and into the distribution space 33. Then, the barrier gas flows via the barrier gas supply channel 26 from the barrier gas distribution cavity 32 to the process gas channel 20.

The barrier gas discharge channel 28 extends from the process gas channel 20 to the barrier gas collecting cavity 34 and opens to the barrier gas collecting cavity 34 and collecting space 35 thereof, as shown in FIG. 4. Accordingly, the barrier gas flows via the barrier gas discharge channel 28 from the process gas channel 20 to the barrier gas collecting cavity and into the collecting space 35. From the collecting space 35 the barrier gas may be exhausted via the barrier gas exhaust conduit 39.

Figure 5:
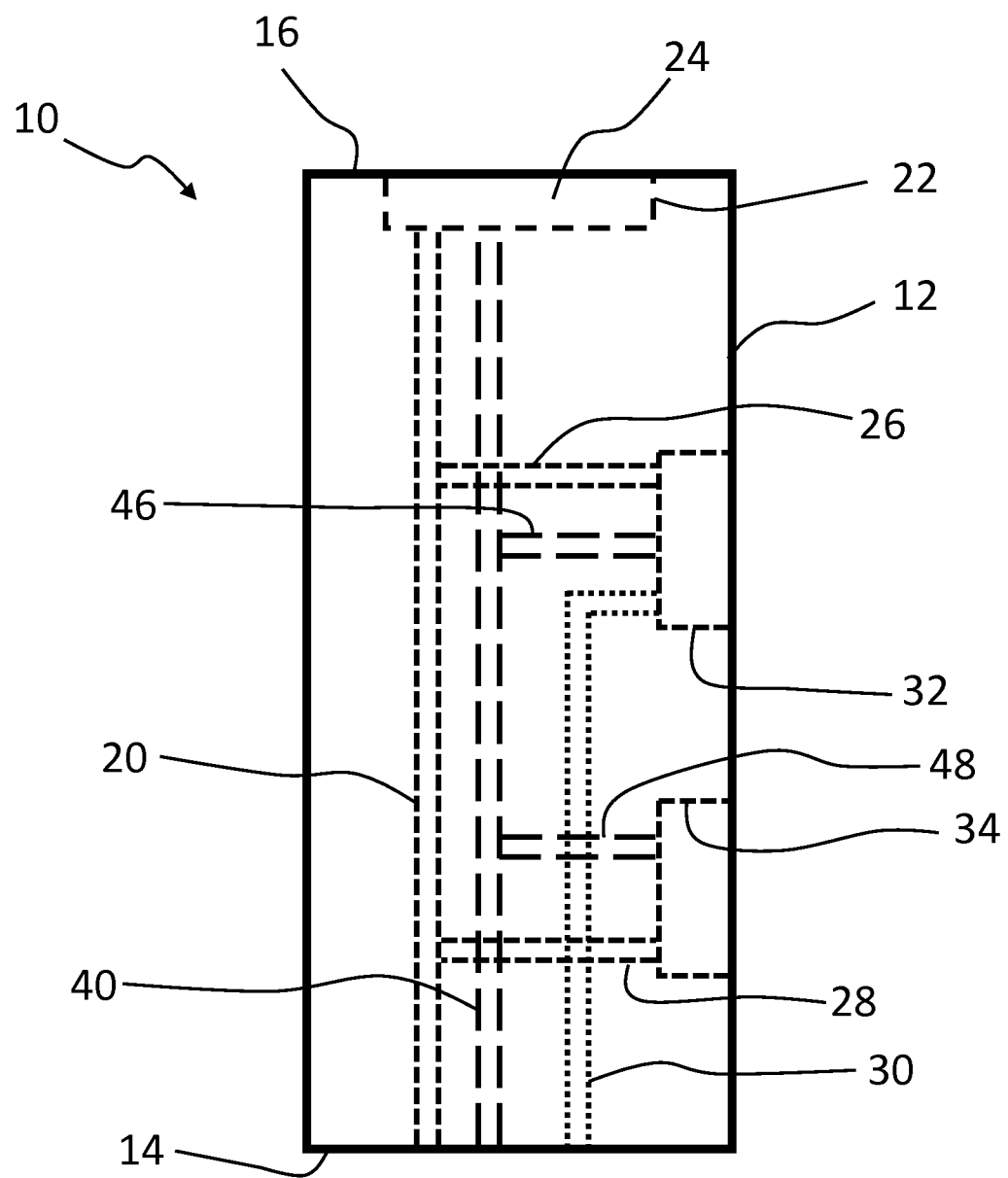
FIG. 5 shows schematically yet another embodiment of the gas distribution unit according to the present invention.

FIG. 5 shows, another embodiment in which there are two process gas channels 20, 40, a first process gas channel 20 and a second process gas channel 40. The first process gas channel 20 extends through the gas distribution unit 10 and is open to the inlet surface 14 and to the outlet surface 16. The second process gas channel 40 extends through the gas distribution unit 10 and is open to the inlet surface 14 and to the outlet surface 16.

The embodiment of FIG. 45 corresponds the embodiment of FIG. 1, but there are two process gas channels 20, 40 having corresponding barrier gas supply channels 26, 46 and barrier gas discharge channels 28, 48. It should be noted, that the gas distribution unit 10 may comprise also more than two separate process gas channels having corresponding barrier gas supply channels and barrier gas discharge channels.

The gas distribution unit 10 further comprises the barrier gas distribution cavity 32 and the barrier gas collecting cavity 34. The gas inlet channel 30 extends from the inlet surface 14 to the gas distribution cavity 32 and opens thereto for supplying barrier gas to the barrier gas distribution cavity 32. The gas distribution unit 10 comprises a first barrier gas supply channel 26 connected to the first process gas channel 20 between the inlet surface 14 and the outlet surface 16. The first barrier gas supply channel 26 is provided between the first process gas channel 20 and the barrier gas distribution cavity 32, and thus opens to the first process gas channel 20 and the barrier gas distribution cavity 32. The gas distribution unit 10 comprises a second barrier gas supply channel 46 connected to the second process gas channel 40 between the inlet surface 14 and the outlet surface 16. The second barrier gas supply channel 26 is provided between the second process gas channel 40 and the barrier gas distribution cavity 32, and thus opens to the second process gas channel 40 and the barrier gas distribution cavity 32.

According to the above mentioned, barrier gas is supplied to the barrier gas distribution cavity 32 via the barrier gas inlet channel 30 is further distributed to the first and second process gas channels via separate first and second barrier gas supply channels 26, 46, respectively. Thus, the barrier gas distribution cavity 32 provides the distribution space 33 from which barrier gas may be supplied to two or more separate process gas channels 20, 40.

The gas distribution unit 10 further comprises a first barrier gas discharge channel 28 connected to the first process gas channel 20 between the inlet surface 14 and the first barrier gas supply channel 26. The first barrier gas discharge channel 28 extends between the first process gas channel 20 and the barrier gas collecting cavity 34, and the first barrier gas discharge channel 26 opens to the first barrier gas supply channel 20 and the barrier gas collecting cavity 34. The gas distribution unit 10 further comprises a second barrier gas discharge channel 48 connected to the second process gas channel 40 between the inlet surface 14 and the second barrier gas supply channel 46. The second barrier gas discharge channel 48 extends between the second process gas channel 40 and the barrier gas collecting cavity 34, and the second barrier gas discharge channel 46 opens to the second barrier gas supply channel 40 and the barrier gas collecting cavity 34.

According to the above mentioned, barrier gas is discharged from to the first and second process gas channels 20, 40 via the separate first and second barrier gas discharge channels 28, 48, respectively, to the barrier gas collecting cavity 34. Thus, barrier gas is collected to the barrier gas collecting cavity 34 from each of the process gas channels 20, 40 and the barrier gas may then be exhausted from the gas distribution unit 10 from the barrier gas collecting cavity via the barrier gas exhaust conduit.

Figure 6:
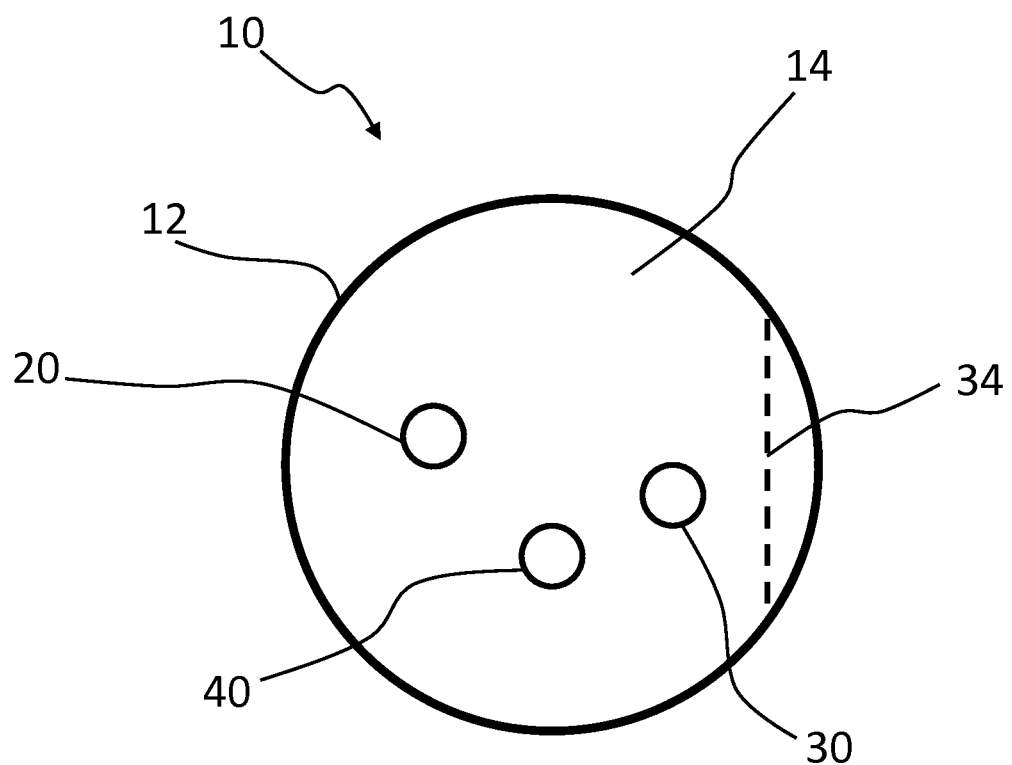
FIG. 6 shows the inlet surface of the gas distribution unit of FIG. 5.

FIG. 6 shows the inlet surface 14 of the gas distribution unit 10 of FIG. 5. The first and second process gas channels 20, 40 and the barrier gas inlet channel 30 extend from the inlet surface 14 into the gas distribution unit 10 and are open to the inlet surface 14.

Figure 7:
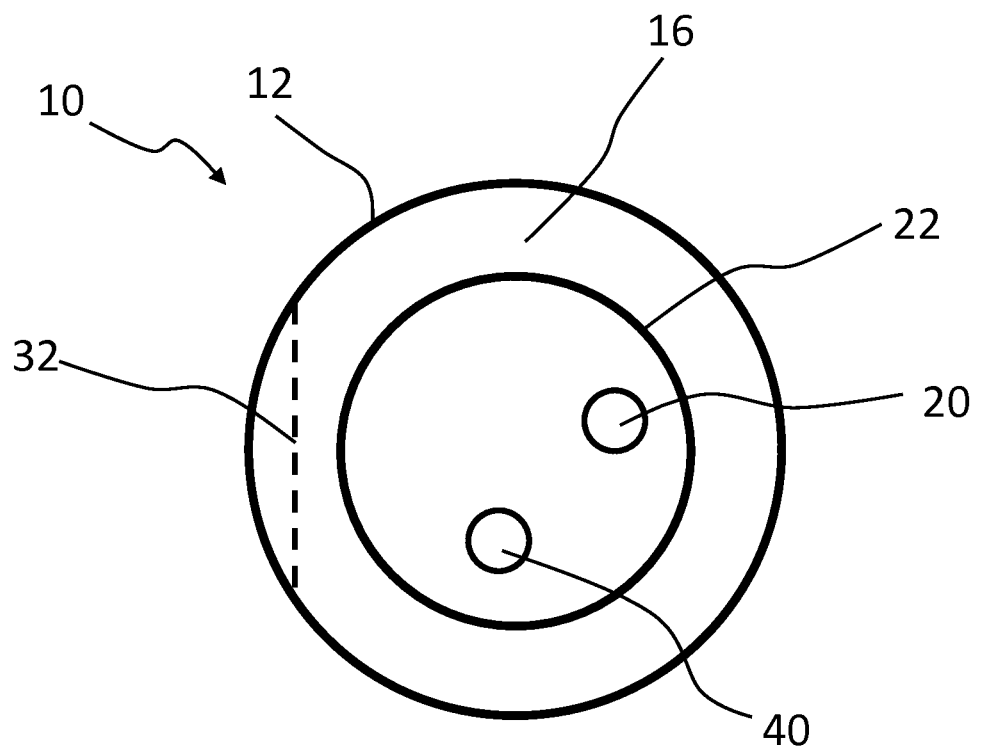
FIG. 7 shows the outlet surface of the gas distribution unit of FIG. 5.

FIG. 7 shows the outlet surface 16 of the gas distribution unit 10 of FIG. 5. The first and second process gas channels 20, 40 extend to the outlet surface, or from the inlet surface 14 to the outlet surface 16, and are open to the inlet surface 16. Further the first and second process gas channels 20, 40 are open to the supply recess 22 provided to the outlet surface 16 and open to the outlet surface 16.

Figure 8:
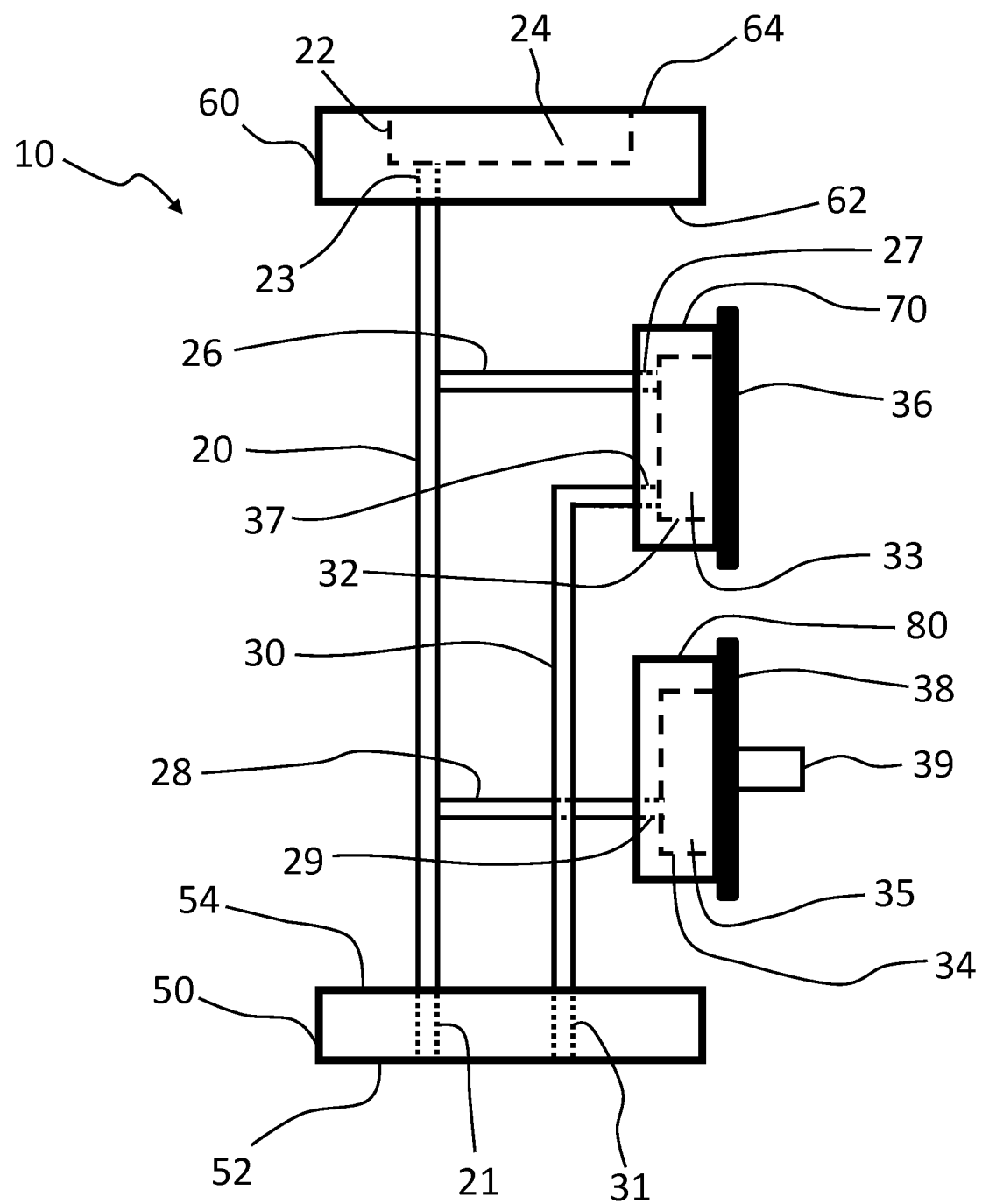
FIGS. 8, 9, 10 and 11 show schematically different embodiments of the gas distribution unit according to the present invention.

FIG. 8 shows an alternative embodiment, in which the gas distribution unit 10 does not comprise one solid body. In this embodiment and in embodiments of FIGS. 9, 10 and 11, the gas inlet channel 30, the process gas channel 20, the barrier gas supply channel 26 and the barrier gas discharge channel 28 are provided as pipes or tubes.

In FIG. 8, the gas distribution unit 10 comprises an inlet flange 50 and an outlet flange 60. The inlet flange 50 comprises the inlet surface 52 and an inlet back surface 54. The outlet flange 60 comprises the outlet surface 62 and an outlet back surface 62. The gas distribution unit 10 comprises the process gas channel 20 as a process gas pipe extending between the inlet flange 50 and the outlet flange 60, or between the inlet back surface 54 and the outlet back surface 62. The inlet flange 50 is further provided with a process gas inlet boring 21 and the outlet flange 60 is provided with process gas outlet boring 23. The process gas pipe 20 extends between the process gas inlet boring 21 and the process gas outlet boring 23 and opens to the process gas inlet boring 21 and the process gas outlet boring 23. The process gas inlet boring 21 extends through the inlet flange 50 from the inlet surface 52 to the inlet back surface 54. The process gas outlet boring 23 extends through the outlet flange 60 from the outlet back surface 62 to the outlet surface 64, or the supply recess 22.

The inlet flange 50 and the outlet flange 60 may be any kind of elements or members, meaning an inlet element 50 and an outlet element 60.

In the embodiment of FIG. 8, the inlet surface 52 of the inlet flange 50 is arranged to face away from the outlet flange 60 and the inlet back surface 54 is arranged to face towards the outlet flange 60. Similarly, the outlet surface 64 of the outlet flange 60 is arranged to face away from the inlet flange 50 and the outlet back surface 62 is arranged to face towards the inlet flange 50. However, the gas distribution unit 10 of FIGS. 8, 9, 10 and 11 may also be such that the inlet flange 50 and the outlet flange 60 are to opposite to each other.

Accordingly, process gas may be supplied from the inlet surface 52 via the process gas inlet boring 21, the process gas pipe 20 and the process gas outlet boring 23 to the outlet surface 64.

The gas distribution unit 10 comprises a separate distribution flange 70 comprising the barrier gas distribution cavity 32 and a separate collection flange 80 comprising the barrier gas collection cavity 34. The distribution flange 70 and the collection flange 8 may be any kind of elements or members, meaning distribution element 70 comprising the barrier gas distribution cavity 32 and a collection element 80 comprising the barrier gas collection cavity 34.

The gas distribution unit 10 comprises the barrier gas inlet channel 30 as a process gas pipe extending between the inlet flange 50 and distribution flange 70, or between the inlet back surface 54 and the distribution flange 70. The inlet flange 50 is further provided with a barrier gas inlet boring 31 and the distribution flange 70 is provided with barrier gas distribution inlet boring 37. The barrier gas pipe 30 extends between the barrier gas inlet boring 31 and the barrier gas distribution inlet boring 37 and opens to the barrier gas inlet boring 31 and the barrier gas distribution inlet boring 37. The barrier gas inlet boring 31 extends through the inlet flange 50 from the inlet surface 52 to the inlet back surface 54. The barrier gas distribution inlet boring 37 extends from outer surface of the distribution flange 70 to the distribution cavity 32 and opens to the distribution cavity 32.

Accordingly, barrier gas may be supplied from the inlet surface 52 via the barrier gas inlet boring 31, the barrier gas inlet pipe 30 and the barrier gas distribution inlet boring 37 to the distribution cavity 32.

The barrier gas supply channel 26 is provided as barrier gas supply pipe between the distribution flange 70 and the process gas pipe 20. The distribution flange 70 comprises a barrier gas distribution outlet boring 27 extending from the distribution cavity 32 to the outer surface of the distribution flange 70 and opening to the distribution cavity 32. The barrier gas supply pipe 26 extends between the barrier gas distribution outlet boring 27 and the process gas pipe 20 and opens to the barrier gas distribution outlet boring 27 and the process gas pipe 20.

Accordingly, barrier gas may be supplied from the distribution cavity 32 via the barrier gas outlet boring 27 and the barrier gas supply pipe 30 to the process gas pipe 20.

The barrier gas discharge channel 28 is provided as barrier gas discharge pipe between the process gas pipe 20 and the collection flange 80. The collection flange 80 comprises a barrier gas collection inlet boring 29 extends from outer surface of the collecting flange 8 to the collecting cavity 34 and opens to the collecting cavity 34. The barrier gas discharge pipe 28 extends between the process gas pipe 20 and the barrier gas collecting cavity 34 and opens to the barrier gas collecting inlet boring 29 and the process gas pipe 20.

Accordingly, barrier gas may be supplied from the process gas pipe 20 via the barrier gas discharge pipe 28 and the barrier gas collecting boring 29 to the barrier gas collecting cavity 34 in the collection flange 80.

In the embodiment of FIG. 8, the pipes 20, 30, 26, 28 may be welded or soldered, or attached some other similar technique to the inlet flange 50, outlet flange, distribution flange 70 and the collecting flange 80 and each other. Thus, gas tight and fixed connections may be provided.

The embodiment of FIG. 8, may also comprise more than one process gas pipe 20, is in FIG. 5. Then each process gas pipe 20 is provided with respective barrier gas supply pipe 26, barrier gas distribution outlet boring 27, barrier gas discharge pipe 28 and barrier gas collecting boring 29.

Figure 9:
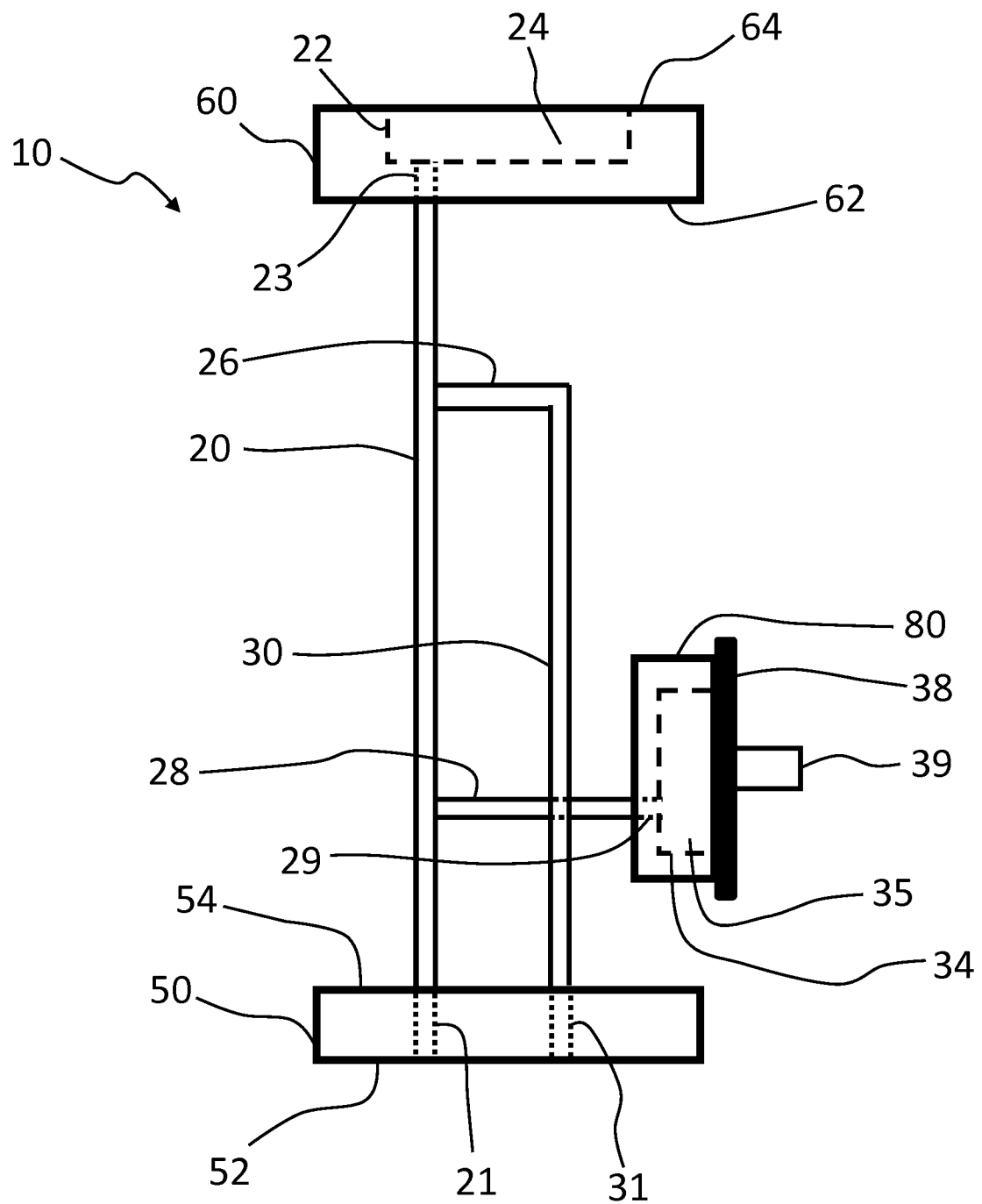

FIG. 9 shows a modification of the embodiment of FIG. 8. In this embodiment, the distribution flange 70, as well as the barrier gas distribution cavity 32, is omitted and the barrier gas inlet pipe 30 is connected directly to the barrier gas supply pipe 26. In other words, the barrier gas inlet pipe 30 and the barrier gas supply pipe 26 may provide one channel or pipe extending from the inlet flange 50 to the process gas pipe 20.

In this embodiment, the barrier gas flows from the inlet surface 14 to the process gas pipe 20 directly without passing through the barrier gas distribution cavity 34. In a case, there are two or more process gas pipes 26 the gas distribution unit 10 comprises respective barrier gas inlet pipe 30 and barrier gas supply pipe 26 as well as barrier gas discharge pipe 28 and barrier gas collecting boring 29 for each process gas pipe 20.

Figure 10:
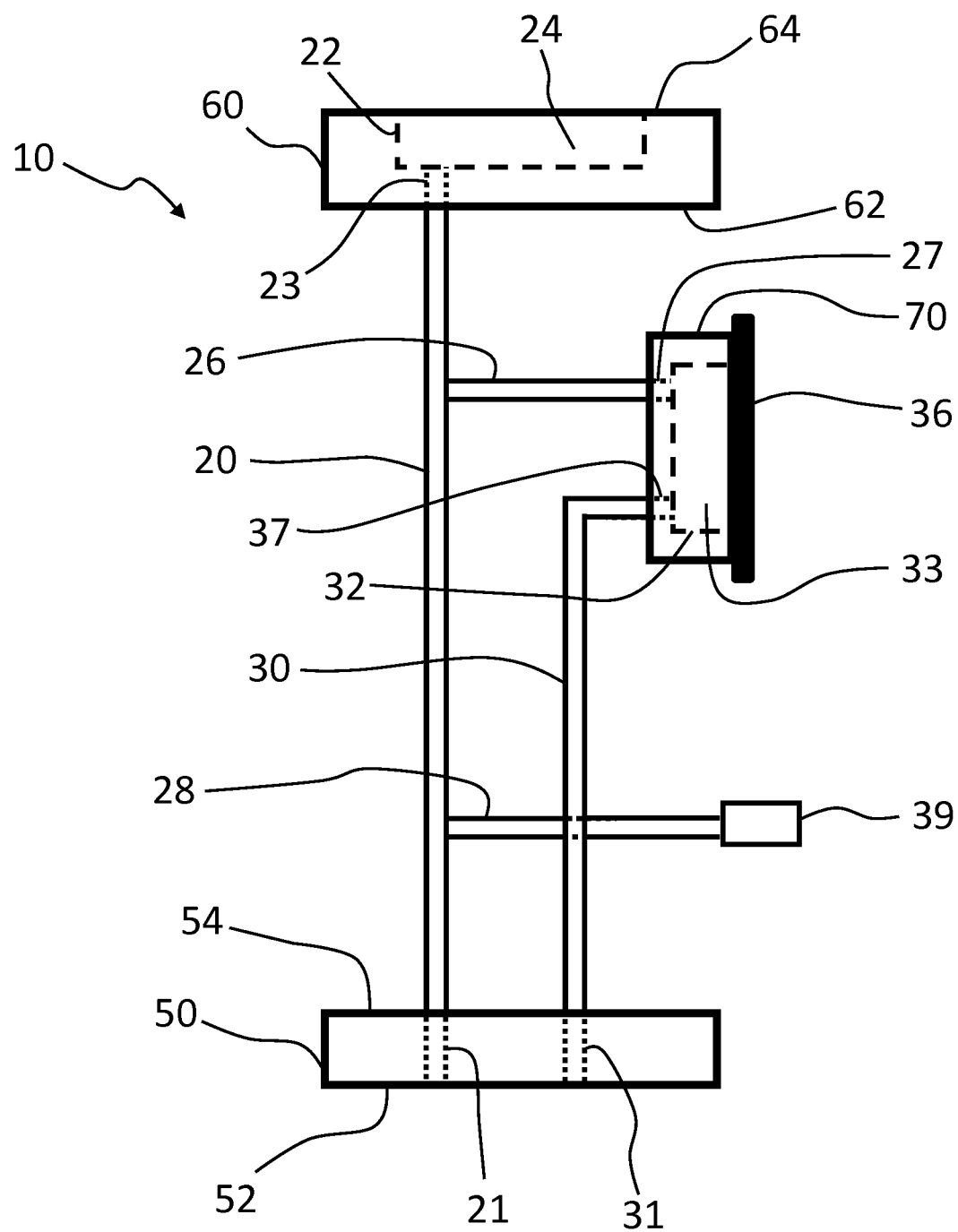

FIG. 10 shows a further modification of the embodiment of FIG. 8. In this embodiment, the collecting flange 80, as well as the barrier gas distribution cavity 32, is omitted and the barrier gas discharge pipe 28 is connected directly to the barrier gas exhaust conduit 39.

In this embodiment, the barrier gas flows from the process gas pipe 20 directly to the barrier gas exhaust conduit 39 without passing through the barrier gas collecting cavity 34. In a case, there are two or more process gas pipes 26 the gas distribution unit 10 comprises respective barrier gas discharge pipe 28 for each process gas pipe 20, and each barrier gas discharge pipe 28 may be connected to the barrier gas exhaust conduit 39 or there may be separate barrier gas exhaust conduit 39 for each barrier gas discharge pipe 28.

Figure 11:
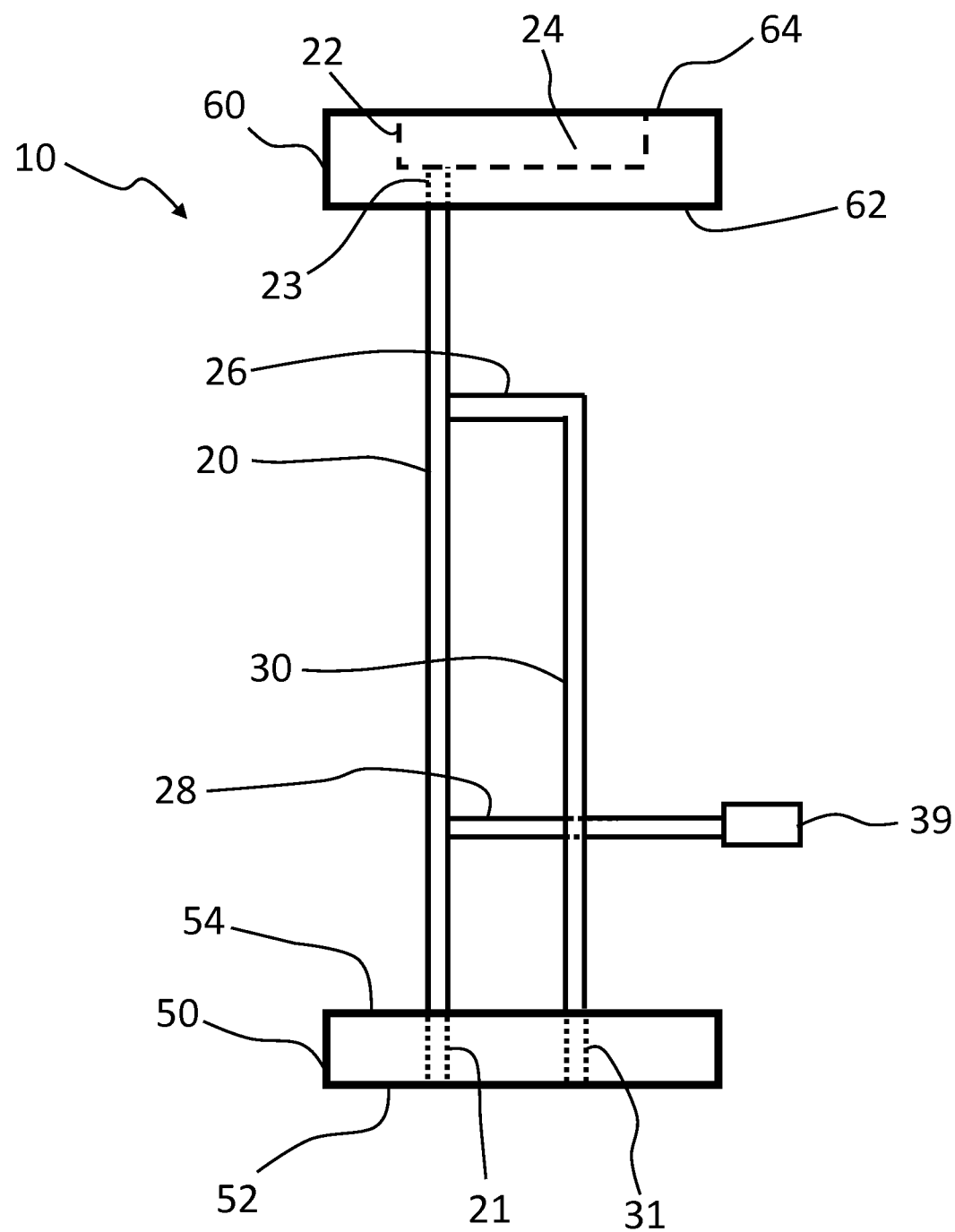

FIG. 11 shows a combination of embodiments of FIGS. 9 and 10. In this embodiment, both the distribution flange 70 and the collecting flange 80, as well as the barrier gas distribution cavity 32 and the barrier gas collecting cavity 34 are omitted. Therefore, all the described in connection with FIGS. 9 and 10 apply to the embodiment of FIG. 11.

Figure 12:
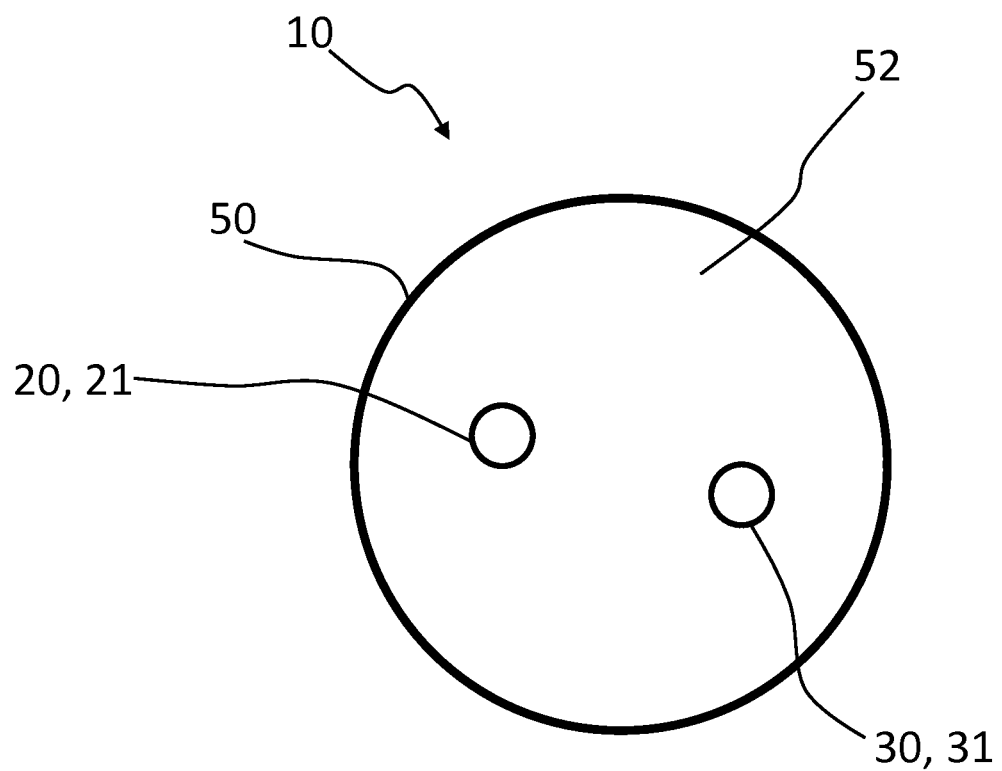
FIG. 12 shows the inlet surface of the gas distribution unit of FIG. 11.

FIG. 12 shows the inlet surface 52 of the inlet flange 50. The process gas inlet boring 21, and the process gas pipe 20, and the barrier gas inlet boring 31, and the barrier gas inlet pipe 30, extend from the inlet surface 52 into the inlet flange 50 and are open to the inlet surface 52.

Figure 13:
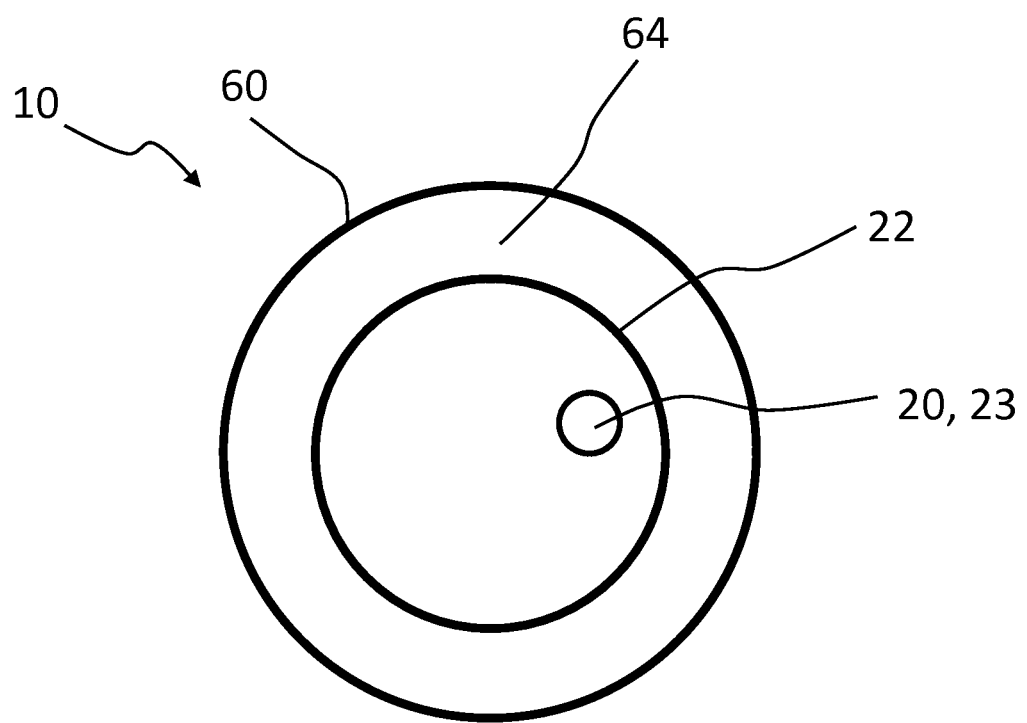
FIG. 13 shows the outlet surface of the gas distribution unit of FIG. 11.

FIG. 13 shows the outlet surface 64 of the outlet flange 60. The process gas outlet boring 23 and the process gas pipe 20 extend from the outlet surface 64 into the outlet flange 60 and are open to the outlet surface 64. Further the process gas outlet boring 23 and the process gas pipe 20 are open to the supply recess 22 provided to the outlet surface 64 and open to the outlet surface 64.

The invention has been described above with reference to the examples shown in the figures. However, the invention is in no way restricted to the above examples but may vary within the scope of the claims.

The invention claimed is:

1. A gas distribution unit in connection with an atomic layer deposition reactor comprising a reaction chamber, the gas distribution unit comprising gas channels for feeding precursor gas and barrier gas, wherein the gas distribution unit comprises:
   an inlet surface via which gases are supplied into the gas distribution unit;
   an outlet surface via which precursor gases are discharged from the gas distribution unit;
   a process gas channel extending through the gas distribution unit and being open to the inlet surface and to the outlet surface;
   a barrier gas inlet fitting connected to the process gas channel between the inlet surface and the outlet surface for supplying barrier gas to the process gas channel; and
   a barrier gas outlet fitting connected to the process gas channel between the inlet surface and the barrier gas inlet fitting for discharging barrier gas from the process gas channel.

2. The gas distribution unit according to the claim 1, wherein the barrier gas inlet fitting comprises a barrier gas supply channel connected to the process gas channel between the inlet surface and the outlet surface.

3. The gas distribution unit according to claim 2, wherein the gas distribution unit comprises:
   a first process gas channel extending through the gas distribution unit and being open to the inlet surface and to the outlet surface;
   a second process gas channel extending through the gas distribution unit and being open to the inlet surface and to the outlet surface;
   a first barrier gas supply channel connected to the first process gas channel between the inlet surface and the outlet surface;
   a second barrier gas supply channel connected to the second process gas channel between the inlet surface and the outlet surface.

4. The gas distribution unit according to claim 3, wherein the gas distribution unit comprises a barrier gas distribution cavity and the barrier gas inlet channel, and that:
   the first barrier gas supply channel is provided between the first process gas channel and a barrier gas distribution cavity; and
   the second barrier gas supply channel is provided between the second process gas channel and a barrier gas distribution cavity.

5. The gas distribution unit according to claim 3, wherein the gas distribution unit comprises a first barrier gas inlet channel, the first barrier gas inlet channel extending between the inlet surface and the first barrier gas supply channel, and a second barrier gas inlet channel, the second barrier gas inlet channel extending between the inlet surface and the second barrier gas supply channel.

6. The gas distribution unit according to claim 3, wherein the gas distribution unit comprises:
   a first barrier gas discharge channel connected to the first process gas channel between the inlet surface and the first barrier gas supply channel; and
   a second barrier gas discharge channel connected to the first process gas channel between the inlet surface and the first barrier gas supply channel.

7. The gas distribution unit according to claim 6, wherein the gas distribution unit comprises a barrier gas collecting cavity, the first barrier gas discharge channel extending between the first process gas channel and the barrier gas collecting cavity, and the second barrier gas discharge channel extending between the second process gas channel and the barrier gas collecting cavity.

8. The gas distribution unit according to the claim 1, wherein the barrier gas inlet fitting comprises:
   a barrier gas distribution cavity and a barrier gas inlet channel, the barrier gas inlet channel is provided between the inlet surface and the barrier gas distribution cavity; or
   a barrier gas distribution cavity and a barrier gas inlet channel, the barrier gas inlet channel is provided between the inlet surface and the barrier gas distribution cavity, and the barrier gas supply channel is provided between the barrier gas distribution cavity and the process gas channel.

9. The gas distribution unit according to the claim 8, wherein the barrier gas distribution cavity is provided between the inlet surface and the outlet surface.

10. The gas distribution unit according to the claim 1, wherein the barrier gas inlet fitting comprises a barrier gas inlet channel, the barrier gas inlet channel extending between the inlet surface and a barrier gas supply channel.

11. The gas distribution unit according to claim 1, wherein the barrier gas outlet fitting comprise a barrier gas discharge channel connected to the process gas channel between the inlet surface and a barrier gas supply channel.

12. The gas distribution unit according to claim 1, wherein the barrier gas outlet fitting comprise a barrier gas collecting cavity and a barrier gas discharge channel, the barrier gas discharge channel extending between the process gas channel and the barrier gas collection cavity.

13. The gas distribution unit according to the claim 12, wherein the barrier gas collecting cavity is provided:
   between the inlet surface and the outlet surface; or
   between the inlet surface and a barrier gas distribution cavity; or
   between the inlet surface and a barrier gas supply channel.

14. The gas distribution unit according to claim 1, wherein the gas distribution unit is a solid body and wherein the gas distribution unit further comprises a process gas channels, a barrier gas inlet channel, barrier gas supply channels and barrier gas discharge channels which comprise borings to the gas distribution unit.

15. The gas distribution unit according to claim 14, wherein the gas distribution unit comprises the inlet surface at a first end of the gas distribution unit, the outlet surface at a second end of the gas distribution unit and one or more side walls extending between the inlet surface and the outlet surface, and that:
   the barrier gas distribution cavity is provided to the one or more side walls between the inlet surface and the outlet surface; or
   the barrier gas collecting cavity is provided to the one or more side walls between the inlet surface and the outlet surface; or
   the barrier gas distribution cavity and the barrier gas collecting cavity are provided to the one or more side walls between the inlet surface and the outlet surface.

16. The gas distribution unit according to claim 1, wherein the gas distribution unit comprises an inlet flange and an outlet flange, the inlet flange having the inlet surface facing away from the outlet flange, the outlet flange having the outlet surface facing away from the inlet flange, and that:

the process gas channel comprising a process gas pipe extending between the inlet flange and the outlet flange; or the process gas channel comprising a process gas pipe extending between the inlet flange and the outlet flange, and the barrier gas inlet channel, the barrier gas supply channels and the barrier gas discharge channels are provided as pipes to the gas distribution unit; or the process gas channel comprising a process gas pipe extending between the inlet flange and the outlet flange, and the barrier gas inlet channel, the barrier gas supply channels and the barrier gas discharge channels are provided as borings to the inlet flange to the gas distribution unit.

17. The gas distribution unit according to claim 16, wherein the gas distribution unit comprises:

a distribution flange comprising the barrier gas distribution cavity; or a collection flange comprising the barrier gas collection cavity; or a distribution flange comprising the barrier gas distribution cavity and a collection flange comprising the barrier gas collection cavity.

* * * * *